United States Patent [19]

Lei et al.

[11] Patent Number: 5,421,894
[45] Date of Patent: Jun. 6, 1995

[54] POWER LOSS RECOVERY FOR WAFER HEATER

[75] Inventors: Lawrence C. Lei, Milpitas; Gean Hsu, Fremont, both of Calif.

[73] Assignee: Applied Materials, Inc., Santa Clara, Calif.

[21] Appl. No.: 201,444

[22] Filed: Feb. 24, 1994

[51] Int. Cl.⁶ .......................................... C23C 16/02
[52] U.S. Cl. .................................... 118/725; 118/728
[58] Field of Search ............................... 118/715, 724

[56] References Cited

U.S. PATENT DOCUMENTS 3,967,132  6/1976  Takamine ........................... 290/4 R Primary Examiner—R. Bruce Breneman
Assistant Examiner—Jeffrie R. Lund
Attorney, Agent, or Firm—Michael A. Glenn; Charles S. Guenzer

[57] ABSTRACT

A pneumatic air cylinder having a normally open solenoid valve provides emergency recovery power to a wafer heater assembly during interruption of an electric power supply. The wafer heater assembly includes a well formed in an upper surface that is adapted to receive and align a wafer during wafer processing. During normal operating conditions, the air cylinder is out of the way of the motion of an electric motor that drives the wafer heater assembly. In the event that the electric power is interrupted, the normally open valve is opened, allowing air to operate the cylinder, drive the heater assembly down, and move the wafer out of the heater well before the heater assembly cools sufficiently to contract and break the wafer. When electric power is resumed, the air supply to the air cylinder is shut off, and the heater is rehomed by the electric motor. Such procedure unlatches a system command to allow the electric motor to position the pneumatic cylinder for future operation.

25 Claims, 3 Drawing Sheets

POWER LOSS RECOVERY FOR WAFER HEATER

BACKGROUND OF THE INVENTION

1. Technical Field

The present invention relates to semiconductor wafer processing equipment. More particularly, the present invention relates to a power loss recovery mechanism for a semiconductor wafer heater.

2. Description of the Prior Art

A heater may be used during semiconductor wafer processing to establish and maintain the wafer at a desired elevated temperature and thereby assure that wafer temperature is optimized to the particular process step being performed. FIG. 1 is a partially sectioned side elevation view of a prior art process environment 10 that includes a semiconductor wafer heating assembly.

During processing, the wafer 28 is rigidly supported by a pedestal, such as a heater assembly 22. The heater assembly comprises a large thermal mass that is maintained at a desired temperature such that the wafer, when placed on the heater assembly, is also maintained at the desired temperature during processing. Ideally, the heater assembly maintains a consistent temperature across the wafer surface, even though processing conditions might otherwise produce a thermal gradient or variation across the wafer surface. To this end, a conventional wafer heater assembly provides several temperature mediation mechanisms in addition to thermal mass, including:

1) a heat source 23, that may be an electrical heater or a conduit for circulating a heated fluid;
2) a wafer backside thermal transfer fluid, such as a coolant or heating gas that is circulated by a conduit 25; and/or
3) a vacuum 26 that draws the wafer into intimate contact with the wafer heater assembly.

Heater assembly temperature is monitored by a thermocouple 24. The thermocouple is placed in the heating assembly, preferably such that temperature at the heater assembly surface, i.e. at the wafer backside, is monitored.

The typical process chamber, such as that shown in FIG. 1, has a dome-shaped upper portion 33. A susceptor 34 that is positioned above the wafer is instrumental during processing in establishing a plasma within the chamber, for example during reactive ion etching. In the figure, a semiconductor wafer 28 is shown resting upon a plurality of support fingers 20, for example just prior to or after a processing step.

The wafer 28 is brought into processing position as a result of the compound movement of the support fingers 20 and a wafer heater assembly 22. This compound movement is effected by a drive 11 that is coupled to a drive shaft 15 by two pulleys 12, 13, and a belt 14. The drive 11 is operable to reversibly drive the shaft 15, which is part of a lead screw assembly 16. As shown by the arrows that are identified by numeric designators 35 and 36, the lead screw assembly 16 raises (and also lowers) the heater assembly, while a spring biased carriage assembly 17, 18, 19 raises (and also lowers) the lift fingers 20. This motion is described in more detail below. A bellows 30 surrounds and seals the heater assembly 22 from the ambient to help maintain a vacuum in the processing environment, and thereby prevent the entry of contaminating particles into the processing environment, while allowing ready movement of the heater assembly and lift fingers during wafer processing.

Operation of the heater assembly is as follows: after the wafer 28 has been placed on the support fingers 20, the shaft 15 is rotated by the drive 11 and belt 14 and pulley 12, 13 mechanism to move the lead screw assembly 16 upwardly, lifting a carrier 82, and correspondingly moving the heater assembly base 21 upwardly to raise the heater assembly 22 into a processing position directly beneath and supporting the wafer. At the same time, upward movement of the carrier 82 pushes the carriage 17, which pushes a push rod 18 and a platform 19 and, correspondingly moves the support fingers 20 upward, thereby raising the wafer upwardly. This compound motion continues until the carriage 17 hits a stop 83, at which point the carriage no longer moves upwardly and, therefore, the fingers 20 no longer move upwardly.

However, the heater assembly 22 continues to be raised into a position beneath the wafer. As the heater assembly moves upwardly, the upper surface of the heater assembly engages with the fingers 20 and lifts the fingers upwardly. This action causes the fingers to seat in a recess in the heater assembly surface, such that the wafer 28 rests on the heater assembly surface. Thus, when the wafer is in processing position, the support fingers have been lowered to the point that they are recessed into the heater assembly, and the wafer is resting within a well 27 formed in the upper surface of the heater assembly.

When wafer processing is completed, the above compound motion is repeated in reverse. That is, the heater assembly, is lowered such that the lift fingers emerge from the heater assembly and support the wafer. As the heater assembly continues to be lowered, the carriage assembly 17, 18, 19 is engaged and forced downwardly, such that the lift fingers are also lowered, and accordingly, the wafer is also lowered.

The above mentioned compound motion may also include a coordinated wafer clamping action as follows: After the wafer is positioned on the support fingers and prior to wafer processing, an actuator 31 that is linked to a wafer clamp assembly 32 is retracted, while at the same time the support fingers are lowered and the wafer heater assembly is raised. Retracting the actuator lowers the wafer clamp assembly into abutment with the edges the wafer, rigidly securing the wafer to the upper surface of the wafer heater assembly during processing.

Actual movement of the wafer clamping assembly may either be coordinated with that of the heater assembly and the support fingers, such that a three-way compound motion is achieved; or wafer clamping may take place after the wafer is placed on the surface of the heater assembly. Wafer clamping may also be accomplished by gravity, such that an actuator may not be required.

After wafer processing is completed, the steps above are reversed. That is, the wafer clamping assembly is lifted from the wafer surface; the wafer heater is lowered, while at the same time the support fingers are raised to lift the wafer from the heater assembly surface. Thereafter, the wafer is removed from the process chamber and another wafer may be loaded into the chamber for processing.

It is not uncommon in a typical wafer fabrication facility that electrical power to the facility will from time-to-time be interrupted, for example due to a power outage or as a result of tripping a circuit breaker or a process interruption. In the absence of electrical power the wafer heater assembly is no longer heated and it therefore begins to cool down. Processing temperatures are on the order of 475° C. and wafer heater expansion is a commonly accepted phenomenon that is considered when designing and dimensioning the various components of the wafer heater assembly.

As discussed above, the wafer heater 22 surface defines a well 27 that is shaped to receive and align the wafer during processing. During an unintentional cool down of the wafer heater, for example during an interval of electrical power loss, the wafer heater assembly will begin to contract. As a result, the diameter of the wafer heater well becomes smaller, until the heater well diameter is less than that of the wafer. As the wafer heater assembly contracts, the inner surfaces of the well (i.e. 6 to 8 guide pins made of a hard material, such as $Al_2O_3$) press against the edges of the wafer, and will eventually break the wafer if electrical power is not quickly restored. The consequences of such wafer breakage are not confined to the loss of the wafer itself. Wafer breakage in situ also necessitates shutting down the process environment for a thorough cleaning to remove any particles that may been produced during the wafer breakage because the particles pose a substantial threat of wafer contamination. This procedure is time consuming and therefore requires that the process chamber be out of service for an extended period of time 12 hours. As a result of such downtime, wafer throughput is impacted, degrading productivity and reducing profitability.

Additionally, power interruption also damages the heater assembly itself because the heater, which is made of aluminum, will give at high temperatures. Fragments of a shattered wafer are very sharp and will cut into the surface of the heater assembly, thereby ruining the flat, precision heater assembly surface that is necessary for the heater assembly to operate as a vacuum chuck.

A recovery system that would remove a wafer from the wafer heater well during a power outage or other service interruption before the wafer heater begins to contract and trap or break the wafer would be welcomed by the semiconductor manufacturing industry.

SUMMARY OF THE INVENTION

This invention addresses the problem of wafer breakage that may result when power is interrupted to a wafer heater assembly and resulting cooling of the wafer heater assembly causes the wafer heater assembly to contract about and break a wafer. In the recovery system taught herein, a pneumatic air cylinder or motor having a normally open solenoid valve provides emergency recovery power during a power failure, for example when electrical power to all systems is interrupted, leaving only a compressed air supply operational. During normal operating conditions, the air cylinder is not supplied with air and therefore stays clear of the path of the heater carrier assembly. In the event of an electric power interruption, the normally opened valve is opened, thereby actuating the air cylinder, and the heater assembly is pushed or pulled downwardly, such that interaction of the various heater assembly transport components lifts the wafer out of the heater assembly well. When electric power is restored, the air supply to the pneumatic cylinder is shut off and the heater is rehomed by the electric drive motor.

An alternate embodiment of the invention provides an air motor that is not supplied with air during normal operating conditions. In the event of an electric power interruption, the normally opened valve is opened, thereby actuating the air motor, such that the heater assembly transport mechanism is operated to lift the wafer out of the heater assembly well. When electric power is restored, the air supply to the pneumatic motor is shut off and the heater is rehomed by the electric drive motor.

DETAILED DESCRIPTION OF THE INVENTION

The invention provides an emergency recovery system that is adapted to operate in the event of an electric power interruption. The exemplary embodiment of the invention is applied to a standard wafer processing environment, where a wafer heater assembly is moved between a home position and a processing position by an electric drive. In the event of electric power interruption, the wafer heater assembly is automatically driven to a safe or home position, such that the wafer is lifted sufficiently above the well to prevent wafer breakage.

The wafer heater assembly is typically maintained at about 475° C. during normal wafer processing, although a wide range of temperatures may be used during wafer processing. Loss of electric power prevents the heater assembly from being heated, and the heater assembly therefore begins to cool down. As the heater assembly cools, it contracts, such that the diameter of the well formed in the wafer surface becomes smaller. If power is not restored to the heater assembly, the diameter of the well will contract to less than that of the wafer retained therein, at which point the wafer will break as a result of the pressure applied to the wafer edges by the heater assembly.

Figure 1:
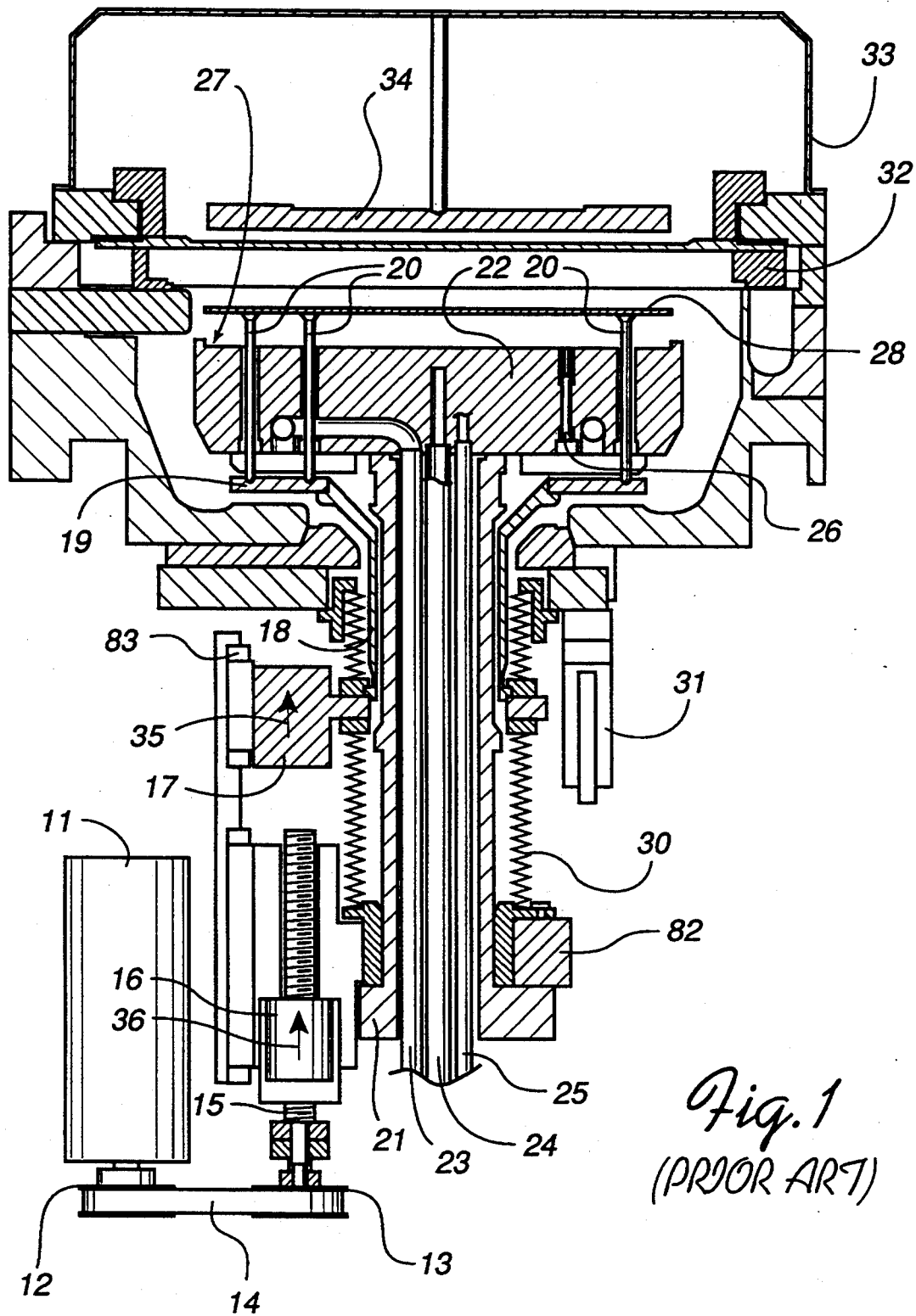
FIG. 1 is a partially sectioned side elevation view of a prior art process environment, including a semiconductor wafer heating assembly.
Figure 2:
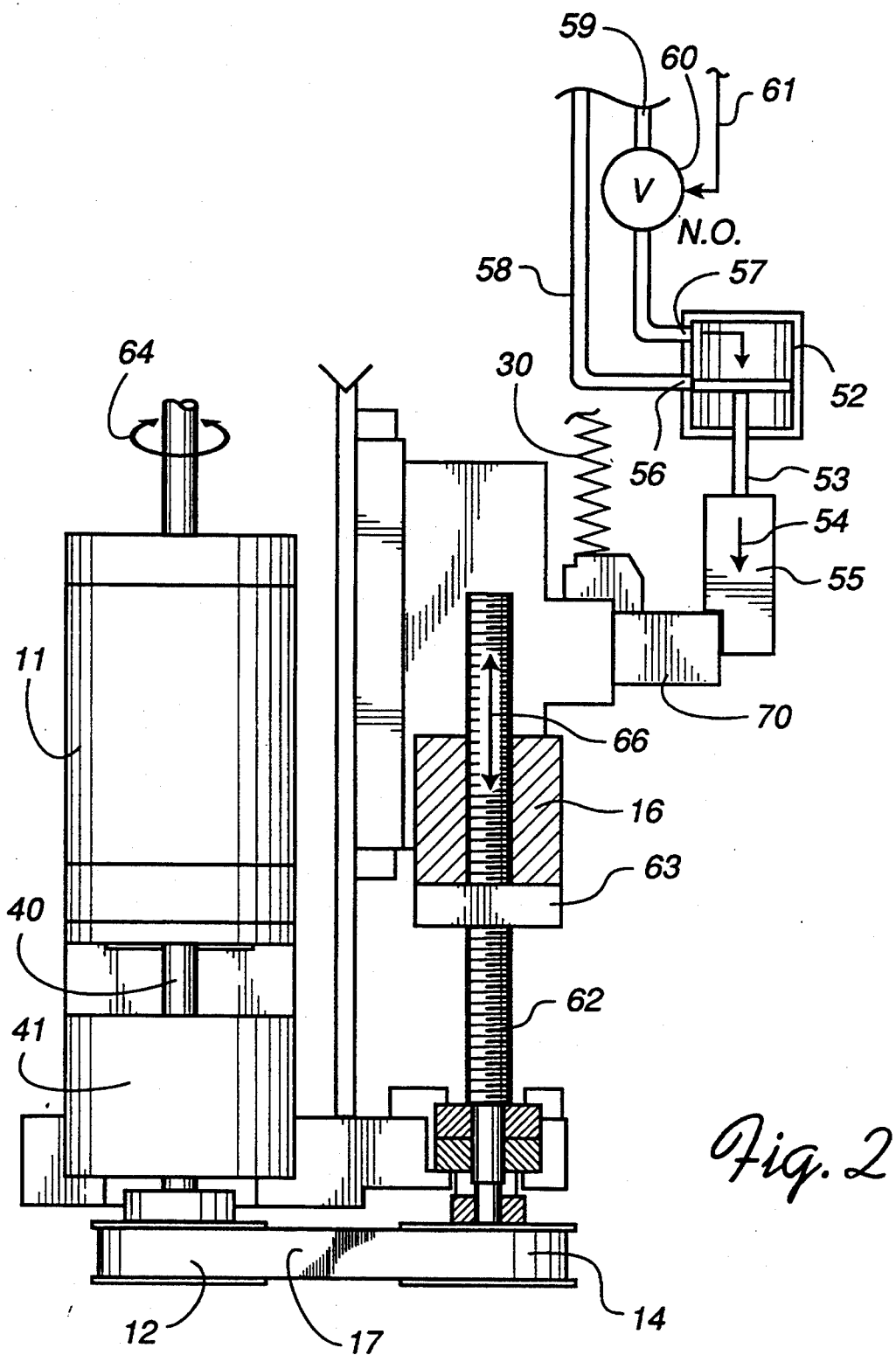
FIG. 2 is a schematic side elevation view of a power loss recovery mechanism for a semiconductor wafer heater assembly according to a first embodiment of the invention.

FIG. 2 is a schematic side elevation view of an exemplary power loss recovery mechanism for a semiconductor wafer heater assembly. As discussed above, a conventional wafer heater assembly includes a motor, such as the electrically operated stepper motor 11 shown in FIGS. 1 and 2. The stepper motor 11 is operable to rotate a shaft 40 in either of a clockwise and a counter-clockwise direction, as shown in FIG. 2 by the arrow which is identified by the numeric designator 64. The shaft 40 drives a gear assembly 41 which, in turn, rotates a pulley 12. The pulley 12 pulls a belt 13 that drives a second pulley 14. The pulley 14 is coupled to a lead screw mechanism 16 that includes a threaded lead screw 62. The lead screw translates the rotary motion of the pulley into either of an upward or downward motion, as shown by the arrow in FIG. 2 identified by numeric designator 66. The lead screw assembly includes collar 63 having a bearing assembly (not shown)

that is adapted to engage with the threaded lead screw 62 and thereby accomplish such translational motion.

Under normal operating conditions, the electric motor 11 operates the lead screw assembly to raise and lower the wafer heater assembly and the support fingers, as discussed above. In the event of an interruption to the supply of electric power, a power loss recovery mechanism, as disclosed herein, actuates a pneumatic cylinder 52 which extends a plunger 53 that, in turn, pushes a ram 55, as shown by the arrow in FIG. 2 identified by numeric designator 54.

The ram 55 is machined to abut with and push a plate 70 that is connected to, and therefore moves with the wafer heater carriage assembly. Thus, downward movement of the ram 55 pushes the wafer heater assembly downwardly, such that the support fingers emerge from the heater assembly surface, thereby lifting the wafer from the well formed in the heater assembly surface, as discussed above. The lead screw described above may be provided with a variety of threads. It is preferred that the lead screw used in conjunction with the invention should have a thread pitch that allows the lead screw to rotate while the heater assembly is pushed downwardly by the ram, and thereby avoid damaging the lead screw or related transport components.

During normal operation of the wafer heater assembly, the pneumatic cylinder 52 is not within the path of heater assembly transport mechanism motion, but rather is beyond the greatest extent of such motion. A normally opened valve 60 is connected to a supply of electric power 61 and, while so powered, is closed, such that a flow of compressed air supplied via an air line 59 to the valve is withheld from an air inlet port 57 on the pneumatic cylinder. Thus, while electric power is provided to the valve, the pneumatic cylinder 52 is positioned out of the travel path of the heater assembly transport mechanism.

In the event of an electric power interruption, the valve is no longer supplied with electric power, and the valve 60 therefore assumes its normally opened status, thereby allowing compressed air to flow to the pneumatic cylinder 52 at the air inlet port 57. Compressed air flows from the pneumatic motor through an outlet port 56 and an air line 58.

When electric power is resumed, the air supply to the air cylinder is shut off, and the heater is rehomed by the electric motor. Such procedure unlatches a system command to allow the electric motor to position the pneumatic cylinder for future operation; or compressed air may be used to return the cylinder to a ready position.

It is a common safety measure in most industrial facilities to provide an uninterruptible source of power in the form of compressed air. A compressed air source is considered uninterruptible because the air supply is stored under pressure in an air tank. Thus, the invention is well suited to exploit this source of stored energy to advantage.

Figure 3:
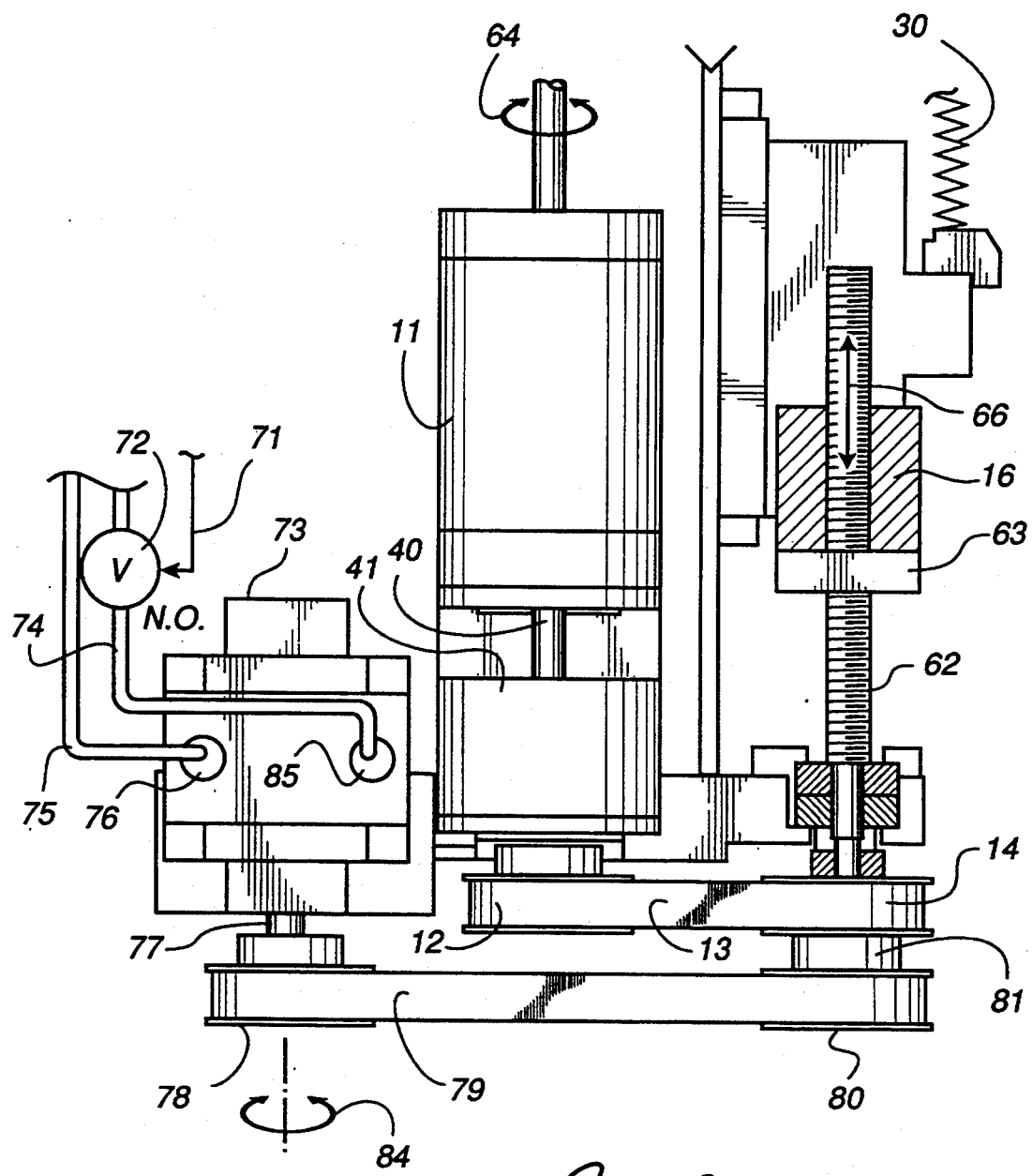
FIG. 3 is a schematic side elevation view of a power loss recovery mechanism for a semiconductor wafer heater assembly according to a second embodiment of the invention.

FIG. 3 is a schematic side elevation view of an alternate embodiment of a power loss recovery mechanism for a semiconductor wafer heater assembly. Under normal operating conditions, the electric motor 11 operates the lead a screw assembly to raise and lower the wafer heater assembly and the support fingers, as discussed above. In the event of an interruption to the supply of electric power, a power loss recovery mechanism, as disclosed herein, actuates a pneumatic motor 73 which rotates a shaft 77 that, in turn, rotates a pulley 78, as shown by the arrow in FIG. 3 identified by numeric designator 84.

The pulley 78 pulls a second belt 79 that turns a pulley 80. The pulley 80 is mounted coaxial with pulley 14 on a common drive shaft 81. Rotation of the pulley 80 turns the lead screw 62 to cause the wafer heater assembly and support fingers to move upwardly and downwardly, as discussed above.

During normal operation of the wafer heater assembly, the pneumatic motor 73 is passive. A normally opened valve 72 is connected to a supply of electric power 71 and, while so powered, is closed, such that a flow of compressed air supplied by an air line 74 to the valve is withheld from an air inlet port 85 on the pneumatic motor. Thus, while electric power is provided to the valve, the pneumatic motor 73 can rotate under the influence of the electric motor 11 or it may be disengaged, for example by a clutching mechanism, but the pneumatic motor itself does not influence operation of the wafer heater assembly.

In the event of an electric power interruption, the valve is no longer supplied with electric power, and the valve 72 therefore assumes its normally opened status, thereby allowing compressed air to flow to the pneumatic motor 73 at the air inlet port. Compressed air flows from the pneumatic motor through an outlet port 76 and an air line 75.

As described above, an interruption in electrical power causes the pneumatic motor to operate. The pneumatic motor turns the pulley 78 and, as a result, the lead screw 62, thereby moving the wafer heater assembly to its home position. Accordingly, the wafer is removed from the well formed in the wafer heater surface and rests on the support fingers. A clutching mechanism may be provided to disengage the pneumatic motor when the heater assembly reaches its home position and bottoms out. The clutch prevents excessive wear on the pulleys and belt, and the possibility of particle generation resulting form such wear.

The pneumatic motor may be placed in any position relative to the lead screw assembly. For example, the pneumatic motor may be positioned above, below, of to the side of the lead screw assembly; the pneumatic motor may be coupled to the lead screw assembly through a belt and pulley arrangement, a flexible coupling, or a direct drive connection may be made to either the stepper motor or the lead screw. Furthermore, the pneumatic motor may be a linear motor, as well as a rotary motor. In the exemplary embodiments of the invention a cylinder is provided, such as supplied by Clippard; or rotary pneumatic motor is provided, such as is supplied by Gast. The normally opened valve used in the exemplary embodiment of the invention is of the type supplied by Bay Pneumatics of Redwood City, Calif. It is anticipated that any known pneumatic motor and valve may be used in practicing the invention.

The pneumatic cylinder or motor may also be used to operate an electrical generator and thereby generate a current when the normal electric power supply is interrupted. Electric power generated by the pneumatic cylinder or motor may be used to operate the stepper motor. It may also be used to operate various safety and/or back up systems associated with the heater assembly, for example such electric power may be used to maintain the contents of a random access memory and therefore prevent the loss of valuable information in the event of a power interruption.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. A power loss recovery mechanism for a semiconductor wafer heater assembly, comprising:
   a pneumatic cylinder coupled to a source of compressed air;
   a mechanical link between said pneumatic cylinder and a wafer heater assembly drive mechanism, said drive mechanism operable to position said wafer heater assembly between a home location and a processing location; and
   a normally opened valve for controlling a flow of compressed air to said pneumatic cylinder, said valve being closed during normal wafer heater assembly operation and being opened in the event electrical service is interrupted, such that said pneumatic cylinder is operated to drive said wafer heater assembly to a home position at the onset of such interruption in electrical service.

2. The mechanism of claim 1, said mechanical link further comprising:
   a ram coupled to a shaft of said pneumatic cylinder to transmit mechanical energy from said pneumatic cylinder to said drive mechanism.

3. The mechanism of claim 1, wherein said pneumatic cylinder is positioned beneath said wafer heater assembly drive mechanism.

4. The mechanism of claim 1, wherein said pneumatic cylinder is positioned above said wafer heater assembly drive mechanism.

5. The mechanism of claim 1, further comprising:
   an electric generator, coupled to said pneumatic cylinder, and adapted to operate any of said wafer heater assembly drive mechanism, a back-up system, and a system memory.

6. A power loss recovery mechanism for a semiconductor wafer heater assembly, said wafer heater assembly having a wafer surface, said wafer surface defining a wafer well in which a wafer is aligned and retained during wafer processing, comprising:
   a pneumatic cylinder coupled to a source of compressed air;
   a mechanical link between said pneumatic cylinder and a wafer heater assembly drive mechanism, said drive mechanism operable to position said wafer heater assembly between a home location and a processing location; and
   a normally opened valve for controlling a flow of compressed air to said pneumatic cylinder, said valve being closed during normal wafer heater assembly operation and being opened in the event electrical service is interrupted, such that said pneumatic cylinder is operated to drive said wafer heater assembly to a home position at the onset of such interruption in electrical service.

7. A power loss recovery mechanism, comprising:
   a drive coupled to an uninterruptible source of power;
   an actuator for supplying power from said uninterruptible source to said drive upon interruption of standard power source; and
   a link between said drive and a process assembly to position said process assembly between a home location and a processing location.

8. A power loss recovery process for a semiconductor wafer heater assembly, comprising the steps of:
   coupling a pneumatic cylinder to a source of compressed air;
   establishing a mechanical link between said pneumatic cylinder and a wafer heater assembly drive mechanism, said drive mechanism operable to position said wafer heater assembly between a home location and a processing location; and
   controlling a flow of compressed air to said pneumatic cylinder with a normally opened valve, said valve being closed during normal wafer heater assembly operation and being opened in the event electrical service is interrupted, such that said pneumatic cylinder is operated to drive said wafer heater assembly to a home position at the onset of such interruption in electrical service.

9. A power loss recovery mechanism for a semiconductor wafer heater assembly, comprising:
   a pneumatic motor for coupling to a source of compressed air;
   a mechanical link between said pneumatic motor and a wafer heater assembly drive mechanism, said drive mechanism operable to move said wafer heater assembly between a home location and a processing location; and
   a normally opened valve for controlling a flow of compressed air to said pneumatic motor, said valve being closed during normal wafer heater assembly operation and being opened in the event electrical service is interrupted, such that said pneumatic motor is operated to drive said wafer heater assembly to a home position at the onset of such interruption in electrical service.

10. The mechanism of claim 9, said mechanical link further comprising:
    a first pulley coupled to a shaft of said pneumatic motor;
    a second pulley coupled to said wafer heater assembly drive mechanism; and
    a belt disposed between said first and said second pulleys to transmit mechanical energy from said first pulley to said second pulley.

11. The mechanism of claim 9, wherein said pneumatic motor is positioned beneath said wafer heater assembly drive mechanism.

12. The mechanism of claim 9, wherein said pneumatic motor is positioned above said wafer heater assembly drive mechanism.

13. The mechanism of claim 9, wherein said pneumatic motor is positioned coaxially with said wafer heater assembly drive mechanism.

14. The mechanism of claim 9, wherein said pneumatic motor is coupled directly to said wafer heater assembly drive mechanism.

15. The mechanism of claim 9, wherein said pneumatic motor is coupled to a lead screw portion of said wafer heater assembly drive mechanism.

16. The mechanism of claim 9, wherein said pneumatic motor is a rotary drive.

17. The mechanism of claim 9, wherein said pneumatic motor is a linear drive.

18. The mechanism of claim 9, further comprising:
    an electric generator, coupled to said pneumatic motor, and adapted to operate any of said wafer heater assembly drive mechanism, a back-up system, and a system memory.

19. The mechanism of claim 9, said pneumatic motor further comprising a clutch.

20. The mechanism of claim 9, wherein said pneumatic motor is coupled to said wafer heater drive mechanism by a flexible coupling.

21. A power loss recovery mechanism for a semiconductor wafer heater assembly, and for use with a source of compressed air, said wafer heater assembly having a wafer surface, said wafer surface defining a wafer well in which a wafer is aligned and retained during wafer processing, comprising:

pneumatic motive means adapted to be coupled to said source of compressed air;

means for moving the wafer and the wafer heater assembly toward and away from each other, said means being adapted to be powered by either of said pneumatic motive means and an alternate drive source; and a normally opened valve for controlling a flow of compressed air to said pneumatic motive means, said valve being closed during normal wafer heater assembly operation and being opened in the event the alternate drive source is interrupted, such that said pneumatic motive means is operated to drive said means for moving.

22. The mechanism of claim 21, said motive means comprising a pneumatic cylinder.

23. The mechanism of claim 21, said motive means comprising a pneumatic motor.

24. The mechanism of claim 21, said alternate drive source comprising an electrical motor.

25. A power loss recovery process for a semiconductor wafer heater assembly, comprising the steps of:

establishing a mechanical link between said pneumatic motor and a wafer heater assembly drive mechanism, said drive mechanism operable to position said wafer heater assembly between a home location and a processing location; and controlling a flow of compressed air to said pneumatic motor with a normally opened valve, said valve being closed during normal wafer heater assembly operation and being opened in the event electrical service is interrupted, such that said pneumatic motor is operated to drive said wafer heater assembly to a home position at the onset of such interruption in electrical service.

* * * * *